United States Patent [19]

Yamazaki

[11] Patent Number: 4,656,101
[45] Date of Patent: Apr. 7, 1987

[54] ELECTRONIC DEVICE WITH A PROTECTIVE FILM

[75] Inventor: Shunpei Yamazaki, Tokyo, Japan

[73] Assignee: Semiconductor Energy Laboratory Co., Ltd., Tokyo, Japan

[21] Appl. No.: 795,917

[22] Filed: Nov. 7, 1985

[30] Foreign Application Priority Data

Nov. 7, 1984 [JP]  Japan ................................. 59-234387
Dec. 13, 1984 [JP] Japan ................................. 59-263281

[51] Int. Cl.[4] ...................... H01L 23/48; H01L 29/00
[52] U.S. Cl. ................................... 428/620; 428/627; 428/632; 357/71
[58] Field of Search ................ 428/620, 627, 632; 357/71

[56] References Cited

U.S. PATENT DOCUMENTS

| | | | |
|---|---|---|---|
| 4,523,966 | 6/1985 | Tsuya et al. | 428/620 |
| 4,525,223 | 6/1985 | Tsuya et al. | 428/620 |
| 4,527,184 | 7/1985 | Fischer | 428/620 |
| 4,576,851 | 3/1986 | Iwamatsu | 428/620 |

Primary Examiner—Veronica O'Keefe
Attorney, Agent, or Firm—Gerald J. Ferguson, Jr.; James E. Bryan; Michael P. Hoffman

[57] ABSTRACT

A electronic device having a structure in which at least one electronic element, including an insulating film or covered with a protecting film, is formed on a substrate, where the insulating or protecting film consist principally of aluminum nitride. Alternatively, the insulating or protecting film can be a laminated member composed of a film consisting principally of aluminum nitride and a film consisting principally of silicon oxide or silicon nitride.

2 Claims, 3 Drawing Figures

ELECTRONIC DEVICE WITH A PROTECTIVE FILM

BACKGROUND OF THE INVENTION

1. Field of the Invention

The present invention relates to an electronic device which has a structure in which at least one electronic element including an insulating film or covered with a protecting film is formed on a substrate. The invention also pertains to a method for forming a film which can be used as the insulating or protecting film of the abovesaid electronic device.

2. Description of the Prior Art

During operation an electronic device of the abovesaid structure is accompanied by heat generation from the electronic element. In order to efficiently let heat escape from the electronic element, it is desirable that the protecting film be high in thermal conductivity.

Furthermore, it is desirable that the protecting film be highly resistant to alkali ions since it is degraded by alkali ions such as sodium ions, potassium ions, etc.

Moreover, it is desirable that the protecting film have as high a degree of electrical insulation as possible when it is formed an electrode, lead or like conductive layer of the electronic element in contact therewith.

Besides, when the electronic element is a programmable memory element which stores binary information "1" (or "0") through charging and stores the binary information "0" (or "1") through discharging of the stored charge by irradiation with ultraviolet rays having a wavelength of, for instance, 184 or 254 nm, it is desirable that the protecting film be highly permeable to the ultraviolet rays.

It is also desirable that the insulating film of the electronic device have a high degree of electrical insulation. This is true especially when the electronic device is an MIS transistor, bipolar transistor or like semiconductor element in which case a semiconductor substrate is used and the insulating film is formed to extend between the substrate and a conductive layer such as an electrode or lead, and when the electronic device is an MIS transistor in which case a semiconductor substrate is used and the insulating film is formed to extend between the substrate and a gate electrode.

For the same reason as that given above with respect to the protecting film, it is also desirable that the insulating film be highly resistant to the alkali ions.

Also it is preferable that the insulating film be highly permeable to ultraviolet rays when the electronic element is the aforementioned programmable memory element.

Heretofore there has been proposed an electronic device of the abovesaid structure in which the insulating film or protecting film is made of silicon nitride. The silicon nitride film is usually formed through a plasma CVD process using, as a material gas, a gas mixture containing silane ($SiH_4$) and ammonia ($NH_3$).

Such an insulating or protecting film made of silicon nitride has a relatively high degree of electrical insulation and is relatively high in resistance to alkali ions and permeable to ultraviolet rays having a relatively long wavelength of 254 nm.

However, this insulating or protecting film is so low in thermal conductivity that substantially no heat can be released.

Furthermore, since the insulating or protecting film of silicon nitride has a relatively small optical energy of about 5 eV, it is permeable to the ultraviolet rays having a relatively long wavelength of 254 nm but is not satisfactorily high in permeability and only slightly permeable to ultraviolet rays of a 185 nm wavelength.

Moreover, the insulating or protecting film of silicon nitride contains relatively large numbers of dangling bonds and clusters of silicon, and hence is not sufficiently high in electrical insulation.

In addition, the insulating or protecting film of silicon nitride is not sufficiently high in the resistance to alkali ions.

As described above, the conventional electronic device employing the silicon nitride film as the insulating or protecting film is defective in that it does not satisfy the above-mentioned requirements.

SUMMARY OF THE INVENTION

It is therefore an object of the present invention to provide a novel electronic device which has a structure in which at least one electronic element including an insulating film or covered with a protecting film is formed on a substrate and which is free from the abovesaid defects of the prior art.

Another object of the present invention is to provide a novel method for the manufacture of a film which is used as the insulating or protecting film of the abovementioned electronic device.

According to the present invention, the insulating or protecting film of the electronic device is formed by a film consisting principally of aluminum nitride, or a laminate member composed of such an aluminum nitride film and a silicon oxide or nitride film consisting principally of silicon oxide or nitride.

The aluminum nitride film forming insulating or protecting film has a markedly high thermal conductivity which is five times or more that of a silicon nitride film heretofore employed as the insulating or protecting film. Since the aluminum nitride film has an optical energy of about 7 eV which is far larger than that of the conventional silicon nitride film used as the insulating or protecting film, it is highly permeable to ultraviolet rays of the 184 nm wavelength as well as to ultraviolet rays of the 254 nm wavelength. Further, the aluminum nitride film contains the dangling bonds and clusters of silicon, but not so large in quantity, hence it has a higher degree of electrical insulation than the silicon nitride film utilized as the insulating or protecting film in the past. Moreover, the aluminum nitride film has a higher resistance to alkali ions than does the conventional silicon nitride film.

Accordingly, the electronic device of the present invention which employs the aluminum nitride film as the insulating or protecting film sufficiently meets the aforementioned requirements.

According to the manufacturing method, the aluminum nitride film is formed on or over a substrate using, as a material gas, a gas mixture of an organic aluminum gas and a nitride gas through a CVD process employing heat, heat and light having a wavelength of 300 nm or less, or a plasma discharge. In this case, trimethyl aluminum (($CH_3$)$_3$Al) or triethyl aluminum (($CH_3$)$_3$Al) can be used as the organic aluminum gas, and ammonia ($NH_3$), hydrazine ($N_2H_4$) or silicon fluoride ($NF_3$ or $N_2F_4$) can be used as the nitride gas. The film can be formed holding the substrate at room temperature to 900° C.

The film forming method of the present invention permits easy fabrication of the aluminum nitride film which has excellent features described above.

Other objects, features and advantages of the present invention will become more fully apparent from the following detailed description taken in conjunction with the accompanying drawings.

DESCRIPTION OF THE PREFERRED EMBODIMENTS

Figure 1:
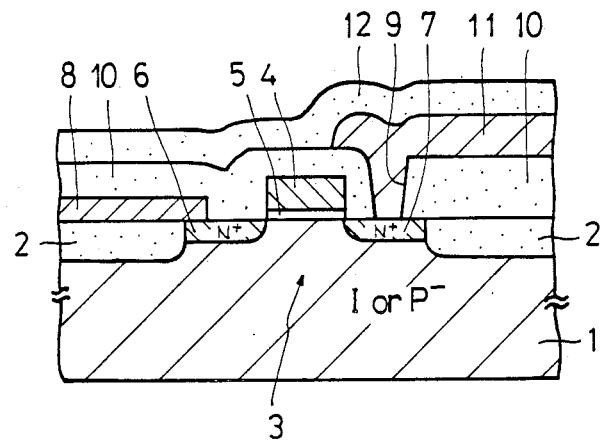
FIG. 1 is a schematic cross-sectional view illustrating a first embodiment of the electronic device of the present invention.

FIG. 1 illustrates an example of an MIS transistor embodying the present invention, which has the following structure.

This example employs, for example, an I- or $P^-$-type semiconductor substrate, which has a field isolation film 2 formed therein on the side of its top surface to define an island-like element forming region 3.

A gate electrode 4 extending also on the field isolation film 2 is formed on the semiconductor substrate 1, with a gate insulating film 5 interposed therebetween, in such a manner as to divide the element forming region 3 into two as viewed from above.

Two $N-$ or $N^+$-type regions are provided as source and drain regions 6 and 7, respectively, in the element forming region 3 on both sides of the gate electrode 4.

A combination source electrode-lead 8 which is connected to the source region 6 and extends therefrom on the field isolation film 2 to the outside is formed on the semiconductor substrate 1.

An inter-layer insulating film 10, which covers the field isolation film 2, the gate electrode 4, the gate insulating film 5, the source region 6 and the drain region 7 and has a window 9 through which the drain region 7 is exposed to the outside is formed on the semiconductor substrate 1.

The inter-layer insulating film 10 is covered with a combination drain electrode-lead 11 which connected to the drain region 7 through the window 9.

A protecting film 12 is formed on the interlayer insulating film 10, covering the combination drain electrode-lead 11. The protecting film 12 is one that consists principally of aluminum nitride in this instance.

The MIS transistor of such a structure is identical in construction with a conventional MIS transistor, provided that the protecting film 12 is a silicon nitride film. Accordingly, it is possible to obtain the transistor function similar to that of the conventional MIS electronic device.

In the MIS transistor of the present invention shown in FIG. 1, however, the protecting film 12 is made of a material consisting principally of aluminum nitride. This film has the excellent features referred to previously.

Therefore, the MIS transistor depicted in FIG. 1 fully meets the requirements that the protecting film 12 be high in thermal conductivity, in resistance to alkali ions and in electrical insulating property.

Incidentally, 30 electronic devices of the present invention, shown in FIG. 1, were subjected to a reliability test in which they were operated at a temperature of 120° C., a pressure of 10 torr and a humidity of 100%. It was found that the devices were useful after 10 hours of test. The conventional electronic device, identical in construction with the device of FIG. 1 except that the protecting film was a silicon nitride, got out of order at a temperature as low as 70° C., whereas the electronic device of the present invention shown in FIG. 1 operated with an intended characteristic.

While in the above the protecting film 12 is formed by an aluminum nitride film alone, it was found experimentally that a protecting film formed by a laminate member composed of a silicon oxide or silicon nitride film and the aluminum nitride film deposited thereon also produced the same excellent effects as mentioned above.

Next, a description will be given, with reference to FIG. 2, of an example of a bipolar transistor embodying the present invention.

This example employs, for instance, a P-type semiconductor substrate 21, in which a field isolation film 22 is formed on the side of its top surface in a manner to define an element forming region 23 and a collector lead-out region 24.

An $N^+$-type collector lead-out semiconductor region 25 is formed in the semiconductor substrate 21 to extend into a region including the element forming region 23 and the collector lead-out region 24.

An N-type semiconductor region is formed as a collector region 26 in the element forming region 23 within the semiconductor region 25.

A P-type semiconductor region is formed as a base region 27 in the collector region 26.

A N-type region is formed as an emitter region 28 in the base region 27.

The semiconductor substrate 21 is covered with an insulating film 40 which has windows 35, 37 and 38 through which the collector lead-out region 25, the base region 27 and the emitter region 28 are exposed to the outside, respectively. The insulating film 40 is made up of a film 41a consisting principally of silicon oxide ($SiO_2$) or silicon nitride and formed on the semiconductor substrate 21 and a film 41b consisting principally of aluminum nitride (AlN) and formed on the film 41a. It must be noted here that the insulating film 40 includes the film 41b consisting principally of aluminum nitride.

On the insulating film 40 is formed a combination collector electrode-lead 45 which is connected to the collector lead-out semiconductor region 25 and extends outwardly thereof.

On the insulating film 40 is formed a combination emitter electrode-lead 48 which is connected to the emitter region 28 and extends outwardly thereof.

Further, an inter-layer insulating layer 58 having a window 57 through which the base region 27 is exposed to the outside is formed on the insulating film 40, covering the combination collector electrode-lead 45 and the combination emitter electrode-lead 48.

The inter-layer insulating layer 58 is partly covered with a combination base electrode-lead 47 which is connected to the base region 27 through the window 57 of the layer 58 and the window 37 of the insulating film 40 and extends outwardly of the base region 27.

Moreover, a protecting film 59 is formed on the interlayer insulating layer 58, covering the base combination base region-lead 47. The protecting film 59 is one that consists principally of aluminum nitride.

The bipolar transistor of such a structure as mentioned above is identical in construction with the conventional bipolar transistor, provided that the film 41b of the insulating film 40 and the protecting film 59 are silicon nitride films. Accordingly, it is possible to obtain the same function as that of the conventional bipolar transistor.

Figure 2:
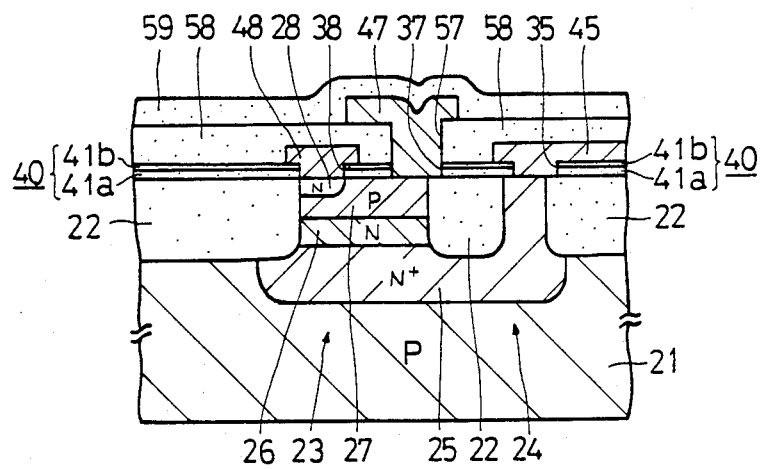
FIG. 2 is a schematic cross-sectional view illustrating a second embodiment of the electronic device of the present invention.

In the bipolar transistor of the present invention shown in FIG. 2, however, the film 41b of the insulating film 40 and the protecting film 59 are films consisting principally of aluminum nitride. The film consisting principally of aluminum nitride possesses the excellent feature described previously.

Therefore, the bipolar transistor of the present invention depicted in FIG. 2 also fully satisfies the aforementioned requirements that the insulating film 40 and the protecting film 59 has a high thermal conductivity, a high resistance to alkali ions and a high degree of electrical insulation.

The same test as mentioned previously in connection with FIG. 1 was conducted on the bipolar transistor of FIG. 2 and good results were obtained.

Figure 3:
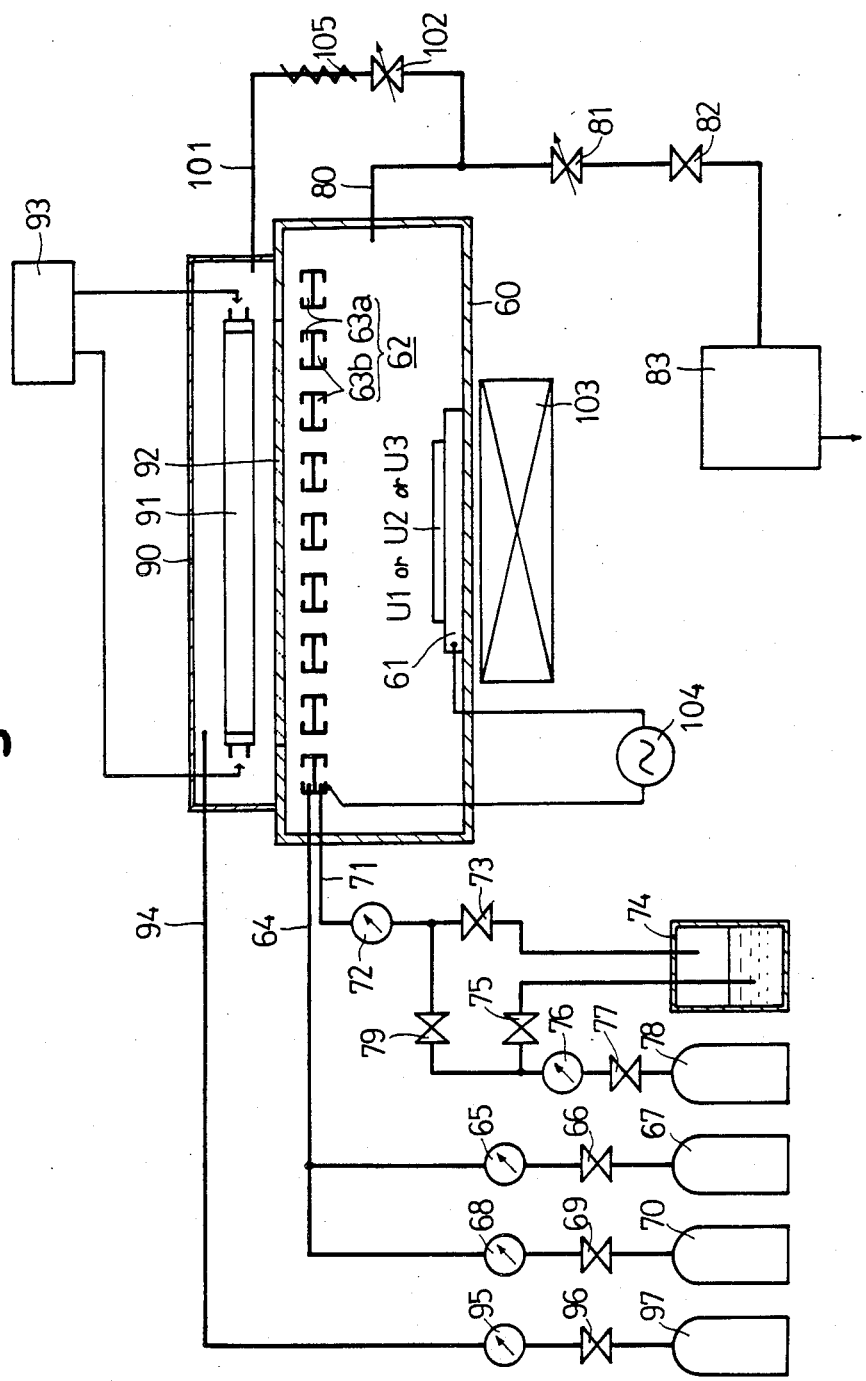
FIG. 3 is a schematic cross-sectional view showing the film forming method of the present invention, the manufacture of an insulating or protecting film shown in FIGS. 1 and 2, and an apparatus employed therefor.

Turning next to FIG. 3, the film manufacturing method of the present invention will be described as being applied to the formation of the protecting film 12 of the MIS transistor shown in FIG. 1, or the film 41b of the insulating film 40 or the protecting film 59 of the bipolar transistor shown in FIG. 2.

A description will be given first of an apparatus for the formation of the film 12, 41b or 59.

The apparatus has a reaction chamber 60.

The reaction chamber 60 is provided with a plurality of conductive nozzles 62, each disposed at the upper part in the chamber 60 and having upper and lower nozzle parts 63a and 63b.

A gas introducing pipe 64 is connected to the upper nozzle parts 63a of the nozzles 62 and extends out of the reaction chamber 60. The gas introducing pipe 64 is connected to an ammonia gas source 67 via a flowmeter 65 and a valve 66 and to a nitrogen gas source 70 via a flowmeter 68 and a valve 69.

Another gas introducing pipe 71 is connected to the lower nozzle parts 63b of the nozzles 62 and extends out of the reaction chamber 60. The gas introducing pipe 71 is connected via a flowmeter 72 and a valve 73 to bubbler 74 which contains trimethyl aluminum ($(CH_3)_3Al$). To the bubbler 74 is connected a nitrogen gas source 78 via a valve 75, a flowmeter 76 and a valve 77. The section between the flowmeter 76 and the valve 75 and the section between the valve 73 and the flowmeter 72 is connected via a valve 79 so as to bypass the bubbler 74.

The reaction chamber 60 is provided with an exhaust pipe 80 which extends through its side wall to the outside. The exhaust pipe 80 is connected to a vacuum pump 83 via a pressure regulating valve 81 and a valve 82.

Provided on the top panel of the reaction chamber 60 is an light source chamber 90, in which is disposed a light source 91 which emits light having a wavelength of 300 nm or less, such as a low-pressure mercury lamp. The light source 91 is connected to an external power supply 93.

The reaction chamber 60 and the light source chamber 90 optically intercommunicate through a window 92 made in a quartz plate disposed therebetween.

The light source chamber 90 has a gas introducing pipe 94 which extends through its side panel to the outside. The gas introducing pipe 94 is connected to a nitrogen gas source 97 via a flowmeter 95 and a valve 96.

The light source chamber 90 has an exhaust pipe 101 which extends to the outside through its side panel on the opposite side from the gas introducing pipe 94. The exhaust pipe 101 is connected to the vacuum pump 83 via a pressure regulating valve 102 and via the aforesaid pressure regulating valve 81 and the valve 82. A heater 105 is proovide on the exhaust pipe 101.

Disposed on the underside of the bottom panel of the reaction chamber 60 is a heat source 103 which is formed by, for example, an argon lamp.

The film 12, 41b or 59 was formed according to the present invention through use of the above-described apparatus in such a manner as follows:

In the case of the film 12 of the MIS transistor described previously with respect to FIG. 1, a structure at the stage immediately before the formation of the protecting film 12 (which structure will hereinafter be referred to simply as the first substrate U1) was mounted on a conductive support plate 61 and placed at the bottom of the reaction chamber 60. In the case of the film 41b of the bipolar transistor described previously with respect to FIG. 2, a structure at the stage immediately after teh formation of the film 41a of the insulating film 40 (which structure will hereinafter be referred to simply as the second substrate U2) was similarly placed in the reaction chamber 60. In the case of the film 49 of the bipolar transistor described previously in connection with FIG. 2, a structure at the stage before the formation of the protecting film 59 (which structure will hereinafter be referred to simply as a third substrate U3) was also similarly placed in the reaction chamber 60.

Next, the reaction chamber 60 was heated by the heat source 103 so that the structures U1, U2 or U3 was heated in the range of room temperature to 900° C., preferably 200° to 500° C., for example, 350° C. At the same time, nitrogen gas was introduced into the light source chamber 90 from the nitrogen gas source 97 while evacuating the chamber 90 by the vacuum pump 83, that is, the nitrogen gas was flowed in the light source chamber 90. Furthermore, the interior of the reaction chamber 60 was irradiated with light of a 300 nm or less wavelength from the light source 91.

Next, ammonia from the ammonia source 67 was introduced into the reaction chamber 60 being carried on nitrogen gas from the nitrogen gas source 70 while evacuating the chamber 60 by the vacuum pump 83, and the ammonia was jetted out from the upper nozzle parts 63a of the nozzles 62 towards the upper wall of the reaction chamber 60 so that the jetted ammonia was reflected by the upper wall downwardly. At this time, the trimethyl aluminum solution in the bubbler 74 was bubbled by nitrogen gas from the nitrogen gas source 78 and the resulting trimethyl aluminum gas was introduced from the bubbler 74 into the reaction chamber 60, wherein it was jetted downwardly from the lower nozzle parts 63b of the nozzles 62. Thus the ammonia and the trimethyl aluminum gas were mixed together. This gas mixture contained 1 volume % of ammonia relative to 5 volume % of trimetyl aluminum. The gas pressure in the reaction chamber 60 was held in the range of 0.1 to 100 Torr, in particular, 10 or 3 Torr.

It was observed that the gas mixture was efficiently excited since it was irradiated by the light of a 300 nm or less wavelength from the light source 91.

In the manner described above, the protecting film 12 of a aluminum nitride described previously with respect to FIG. 1, the film 41b of aluminum nitride described previously in connection with FIG. 2 or the protecting film 49 of aluminum nitride described previously in connection with FIG. 2 was deposited on the substrate U1, U2 or U3 by the vapor phase reaction

$$Al(CH_3)_3 + NH_3 \rightarrow AlN + 4CH_3.$$

The nitride aluminum film was deposited at a rate of 2.1 Å/sec when the gas pressure in the reaction chamber 60 was 10 Torr and at a rate of 1.4 Å/sec when the gas pressure was 3 Torr.

When the abovesaid aluminum nitride film 12, 41b or 59 was formed, the gas introducing pipe between the bubbler 74 and the reaction chamber 60 was heated to about 100° C., preventing the trimethyl aluminum from adsorption to the gas introducing pipe. Moreover, the pressure of the nitrogen gas supplied into the light source chamber 90 was regulated so that the window 92 would not be broken owing to the pressure difference between the reaction chamber 60 and the light source chamber 90. An exhaust gas which would otherwise leak from the reaction chamber 60 via the pressure regulating valve 102 and the pipe 101 into the light source chamber 90 was decomposed by heating to about 600° C. by the heater 105, thereby avoiding that the light from the light source 91 would be subject to absorption loss by the introduction of the exhaust gas into the light source chamber 90.

Although in the above trimethyl aluminum, $((CH_3)_3Al)$ and ammonia $(NH_3)$ were used in combination as the material gas, the aluminum nitride film 12, 41b or 59 similar to the above-described could equally be obtained by the combined use of trimethyl aluminum and hydrazine $(N_2H_4)$ or fluorine nitride $(NF_3$ or $N_2F_4)$ and triethyl aluminum $((C_2H_5)_3Al)$ and ammonia, hydrazide or fluorine nitride $(NF_3$ or $F_2F_4)$.

Besides, while in the above the aluminum nitride film is formed through the CVD process using heat and light, it is also possible to employ a CVD process using heat alone, or a CVD process using a plasma discharbe by connecting a plasma power source 104 between the support plate 61 and the nozzle 62.

It will be apparent that many modifications and variations may be effected without departing from the scope of the novel comcepts of the present invention.

What is claimed is:

1. An electronic device which has a structure in which at least one electronic element including an insulating film or covered with a protecting film is formed on a substrate, the insulating or protecting film consisting principally of aluminum nitride.

2. An electronic device which has a structure in which at least one electronic element including an insulating film or covered with a protecting film is formed on a substrate, the insulating or protecting film being a laminated member composed of a film consisting principally of aluminum nitride and a film consisting principally of silicon oxide or silicon nitride.

* * * * *